(12) United States Patent
Lin

(10) Patent No.: US 8,472,218 B2
(45) Date of Patent: Jun. 25, 2013

(54) MISMATCH-FREE CHARGE PUMP AND METHOD THEREOF

(75) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 428 days.

(21) Appl. No.: 12/967,118

(22) Filed: Dec. 14, 2010

(65) Prior Publication Data

US 2011/0140676 A1    Jun. 16, 2011

Related U.S. Application Data

(60) Provisional application No. 61/286,333, filed on Dec. 14, 2009.

(51) Int. Cl.
*H02M 3/07* (2006.01)
(52) U.S. Cl.
USPC .......................................................... 363/60
(58) Field of Classification Search
USPC ............................... 323/312, 315; 363/59, 60
See application file for complete search history.

(56) References Cited

U.S. PATENT DOCUMENTS

| 6,107,849 | A  | * | 8/2000 | Williams et al. | 327/157 |
| 7,492,197 | B2 |   | 2/2009 | Lin et al.      |         |
| 2008/0191783 | A1 | * | 8/2008 | Sudjian et al. | 327/536 |
| 2010/0090753 | A1 | * | 4/2010 | Yan            | 327/536 |
| 2011/0140676 | A1 | * | 6/2011 | Lin            | 323/271 |
| 2011/0140767 | A1 | * | 6/2011 | Lin            | 327/536 |
| 2011/0234273 | A1 | * | 9/2011 | Lin et al.     | 327/157 |

* cited by examiner

*Primary Examiner* — Jeffrey Sterrett
(74) *Attorney, Agent, or Firm* — McClure, Qualey & Rodack, LLP

(57) ABSTRACT

The charge-pump apparatus is disclosed having a substantially fixed current source for outputting a first current of a first polarity; a variable current source for outputting a second current of a second polarity opposite to the first polarity; a first current steering network for steering the first current into either an output node or a termination node in accordance with a first control signal; a second current steering network for steering the second current into either the output node or the termination node in accordance with a second control signal; a voltage follower for receiving a first voltage associated with the output node and outputting a second voltage at an internal node; a current sensor inserted between the termination node and the internal node for sensing a current flowing between the termination node and the internal node; and a feedback network for adjusting the variable current source in accordance with an output of the current sensor.

20 Claims, 6 Drawing Sheets

MISMATCH-FREE CHARGE PUMP AND METHOD THEREOF

CROSS-REFERENCE TO RELATED APPLICATION

The application claims priority to U.S. provisional patent application Ser. No. 61/286,333, filed Dec. 14, 2009, entitled "MISMATCH-FREE CHARGE PUMP AND METHOD THEREOF."

BACKGROUND OF THE INVENTION

1. Field of the Invention

The present disclosure generally relates to charge pumps and more particularly to charge pump circuits that are free of source-sink mismatch.

2. Description of Related Art

Charge pumps are widely used in numerous applications, including frequent use in phase lock loop circuits. As depicted in FIG. 1, a typical charge pump 100 comprises a current source I1, a current sink I2, a first switch S1 controlled by a first logical signal UP, and a second switch S2 controlled by a second logical signal DN. Throughout this disclosure, VDD denotes a first substantially fixed-potential circuit node (usually at a power supply output), and VSS denotes a second substantially fixed-potential circuit node (usually referred to as "ground"). It will also be appreciated that a current sink may also be referred to as a current source (only that it outputs a negative current). When the first logical signal UP is asserted, the current source I1 injects current into circuit node 105 through the first switch S1; when the second logical signal DN is asserted, the source sink I2 drains current from circuit node 105 through the second switch S2. Circuit node 105 is coupled to a load circuit 110 comprising a load capacitor CL, resulting in an output voltage VOUT. An ideal current source (sink) has infinite output resistance and thus will inject (drain) a constant current regardless of a voltage at its output. In practice, however, a real-world current source (sink) has finite output resistance and its output current depends on the voltage at its output. For instance, when the current source I1 (sink I2) is implemented by a PMOS (NMOS) transistor, the magnitude of its output current will decrease (increase) when the output voltage VOUT increases. In many applications, for instance phase lock loop, it is highly desirable that the magnitude of the output current of the current source I1 matches that of the current sink I2. When there is a mismatch (in output current magnitude) between the current source I1 and the current sink I2, the system performance usually degrades.

Therefore, method and apparatus for a charge pump free of the source-sink mismatch is desired.

BRIEF SUMMARY OF THIS INVENTION

In an embodiment, an apparatus is disclosed, the apparatus comprising: a substantially fixed current source for outputting a first current of a first polarity; a variable current source for outputting a second current of a second polarity opposite to the first polarity; a first current steering network for steering the first current into either an output node or a termination node in accordance with a first control signal; a second current steering network for steering the second current into either the output node or the termination node in accordance with a second control signal; a voltage follower for receiving a first voltage associated with the output node and outputting a second voltage at an internal node; a current sensor inserted between the termination node and the internal node for sensing a current flowing between the termination node and the internal node; and a feedback network for adjusting the variable current source in accordance with an output of the current sensor.

In an embodiment, a method is disclosed, the method comprising: generating a substantially fixed current of a first polarity; steering the substantially fixed current of the first polarity into either an output node or a termination node in accordance with a first logical signal; generating a variable current of a second polarity opposite to the first polarity under control of a control signal; steering the variable current of the second polarity into either the output node or the termination node in accordance with a second logical signal; tracking a voltage associated with the output node by using a voltage follower; sensing a current flowing between the termination node and an internal node at an output of the voltage follower using a current sensor; and generating the control signal in accordance with an output of the current sensor.

DETAILED DESCRIPTION OF THE DRAWINGS

DETAILED DESCRIPTION OF THIS INVENTION

Embodiments of the present invention are directed to charge pumps, and in particular to method and apparatus of charge pump free of source-sink mismatch. While the specification describes several example embodiments of the invention considered best modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1:
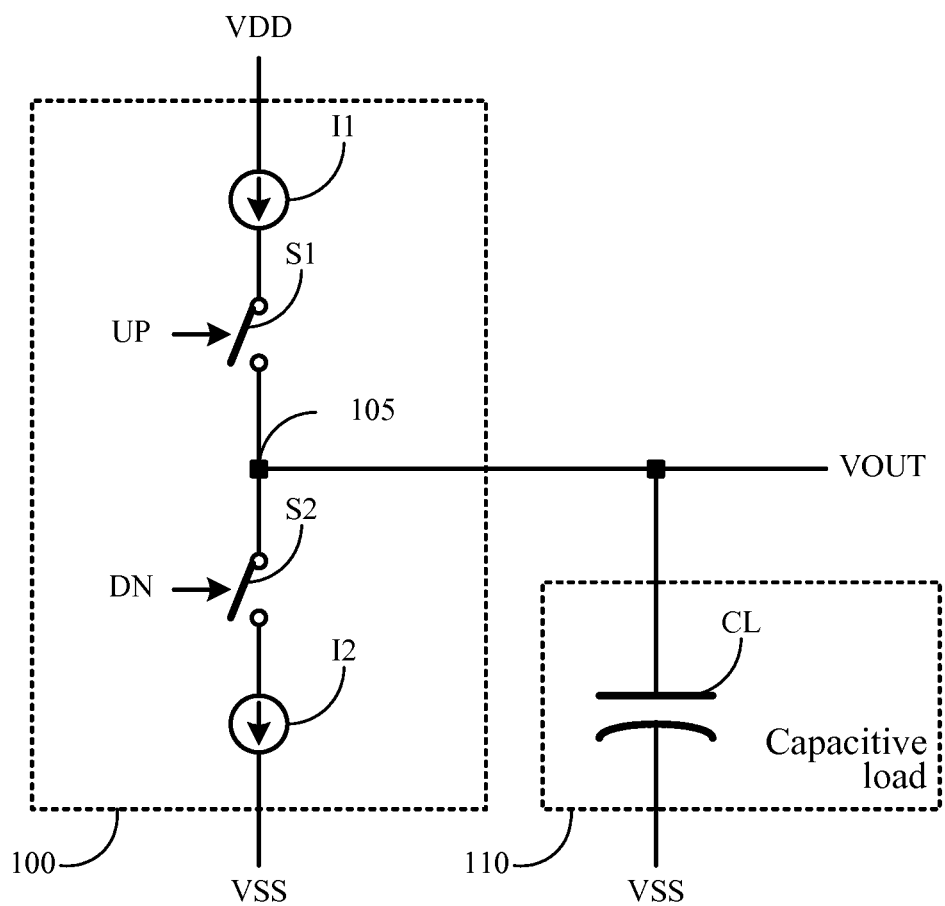
FIG. 1 shows a schematic diagram of a prior art charge pump circuit.
Figure 2A:
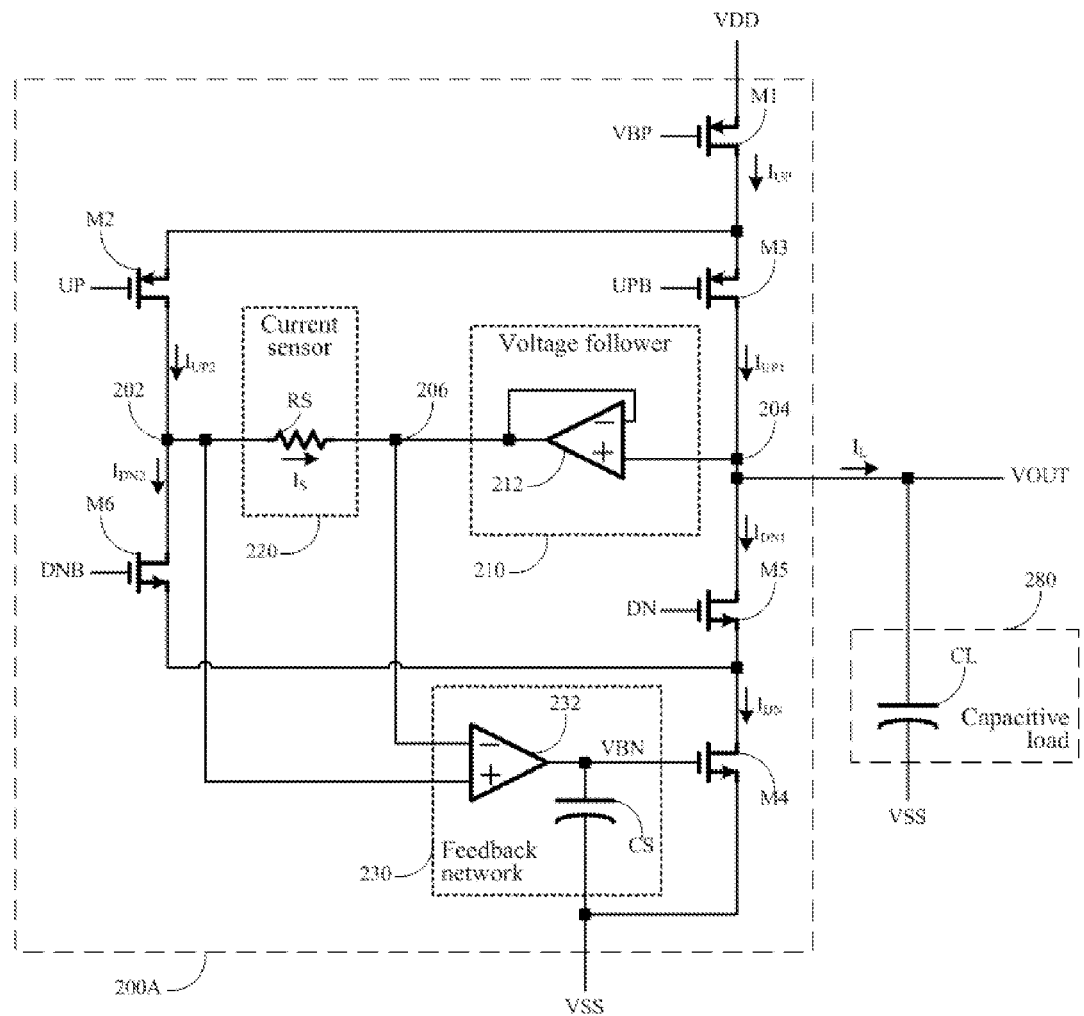
FIG. 2A shows a charge pump circuit in accordance with an embodiment of this present disclosure.

This present disclosure is applicable to a variety of semiconductor circuit technologies. By way of example but not limitation, an embodiment using CMOS (complementary metal-oxide semiconductor) circuit technology is used. A charge pump 200A in accordance with the present invention is depicted in FIG. 2A. Charge pump circuit 200A comprises: a current source embodied by a first PMOS transistor M1 biased by a substantially fixed bias voltage VBP for outputting a positive current $I_{UP}$; a first switch embodied by a second PMOS transistor M2 controlled by a first logical signal UP for steering the positive current $I_{UP}$ into current $I_{UP2}$ flowing into a termination node 202 when the first logical signal UP is low; a second switch embodied by a third PMOS transistor M3 controlled by UPB (which is a logical inversion of the first logical signal UP) for steering the positive current $I_{UP}$ into current $I_{UP1}$ flowing into an output node 204 when the first logical signal UP is high; a current sink embodied by a first NMOS transistor M4 biased by a variable bias voltage VBN for outputting a negative current $I_{DN}$; a third switch embodied by a second NMOS transistor M5 controlled by a second logical signal DN for steering the negative current $I_{DN}$ into current $I_{DN1}$ flowing out of the output node 204 when the second logical signal UP is high; a fourth switch embodied by a third NMOS transistor M6 controlled by DNB (which is a logical inversion of DN) for steering the negative current $I_{DN}$ into current $I_{DN2}$ flowing out of the termination node 202 when the second logical signal DN is low; a voltage follower 210 embodied by a first operational amplifier 212 configured in a unit-gain non-inverting amplifier topology for receiving a voltage at the output node 204 and outputting a voltage at an internal node 206; a current sensor 220 inserted between the internal node 206 and the termination node 202 for sensing a current $I_S$ flowing from the termination node 202 to the internal node 206; and a feedback network 230 embodied by a second operational amplifier 232 terminated with an integrating capacitor CS for establishing the variable bias voltage VBN by monitoring the current $I_S$ sensed by the current sensor 220. The output node 204 is terminated by a capacitive load 280 comprising a load capacitor CL for establishing an output voltage VOUT. The feedback network adjusts the variable bias voltage VBN in a closed-loop manner such that a mean value of $I_S$ is zero, i.e. the average current flowing between the internal node 206 and the termination node 202 is zero. Certain principles of the present disclosure are described below.

In a steady state of a typical application of a charge pump involving a closed-loop control (i.e. phase lock loop), the mean value of the load current $I_L$ that the charge pump circuit 200A provided to the load circuit 280 must be zero, otherwise the output voltage VOUT will not be bounded. That is, $$<I_L> = <I_{UP1} - I_{DN1}> = 0 \quad (1)$$

The current $I_S$ sensed by the current sensor 220 can be written as $$I_S = I_{UP2} - I_{DN2} \quad (2)$$
$$= [I_{UP} - I_{UP1}] - [I_{DN} - I_{DN1}]$$
$$= [I_{UP} - I_{DN}] - [I_{UP1} - I_{DN1}]$$

The mean current of $I_S$ can be written as $$\langle I_S \rangle = \langle I_{UP} - I_{DN} \rangle - \langle I_{UP1} - I_{DN1} \rangle \quad (3)$$
$$= \langle I_{UP} - I_{DN} \rangle$$
$$= I_{UP} - I_{DN}$$

If $I_{UP}$ is greater than $I_{DN}$, it results in a positive mean value of $I_S$; this causes an increase to the variable bias voltage VBN and thus an increase to $I_{DN}$ to adjust $I_{DN}$ toward matching $I_{UP}$. If $I_{UP}$ is smaller than $I_{DN}$, it results in a negative mean value of $I_S$; this causes a decrease to the variable bias voltage VBN and thus a decrease to $I_{DN}$ to adjust $I_{DN}$ toward matching $I_{UP}$. In either case, the variable bias voltage VBN is adjusted in a closed-loop manner so as to make the variable current $I_{DN}$ equal the substantially fixed current $I_{UP}$.

Embodiments of an operational amplifier is well known to those of ordinary skill in the art and thus not described in detail here.

Figure 2B:
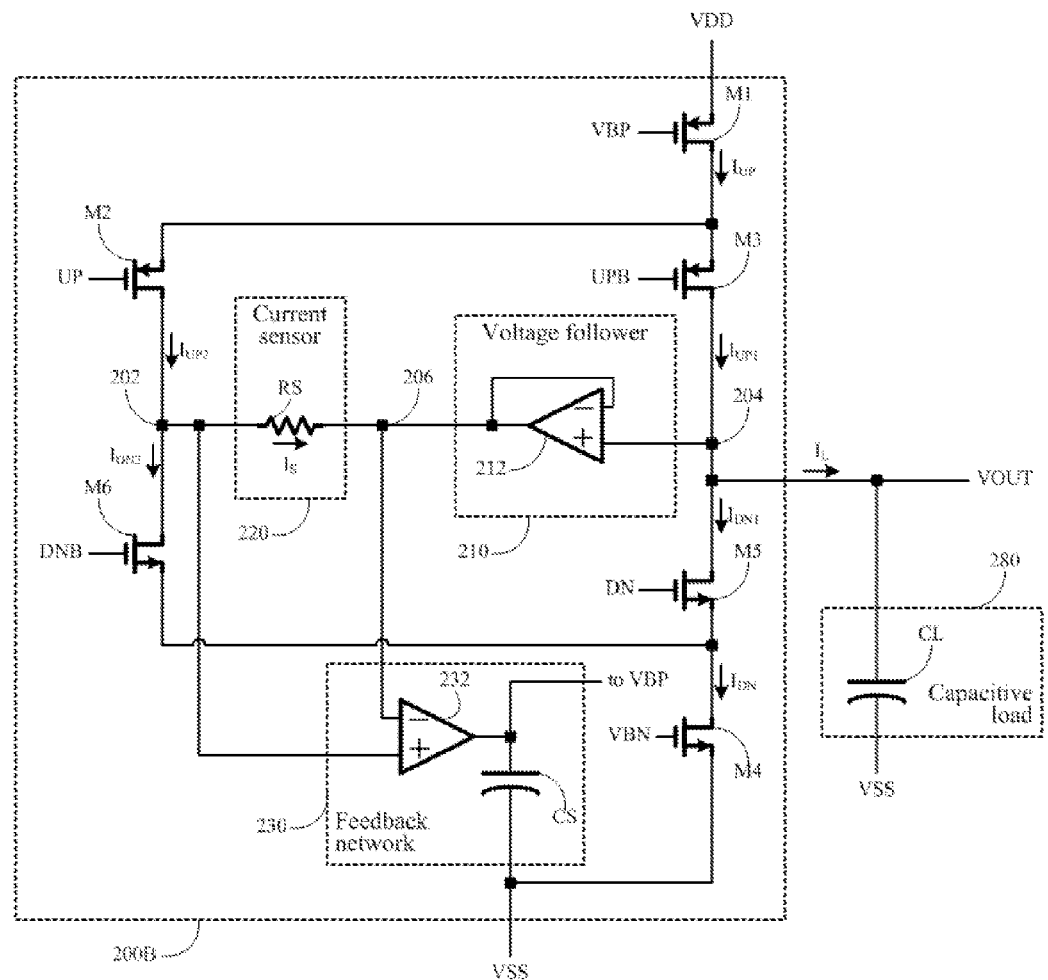
FIG. 2B shows an alternative embodiment of a charge pump circuit constructed in accordance with the invention.
Figure 2C:
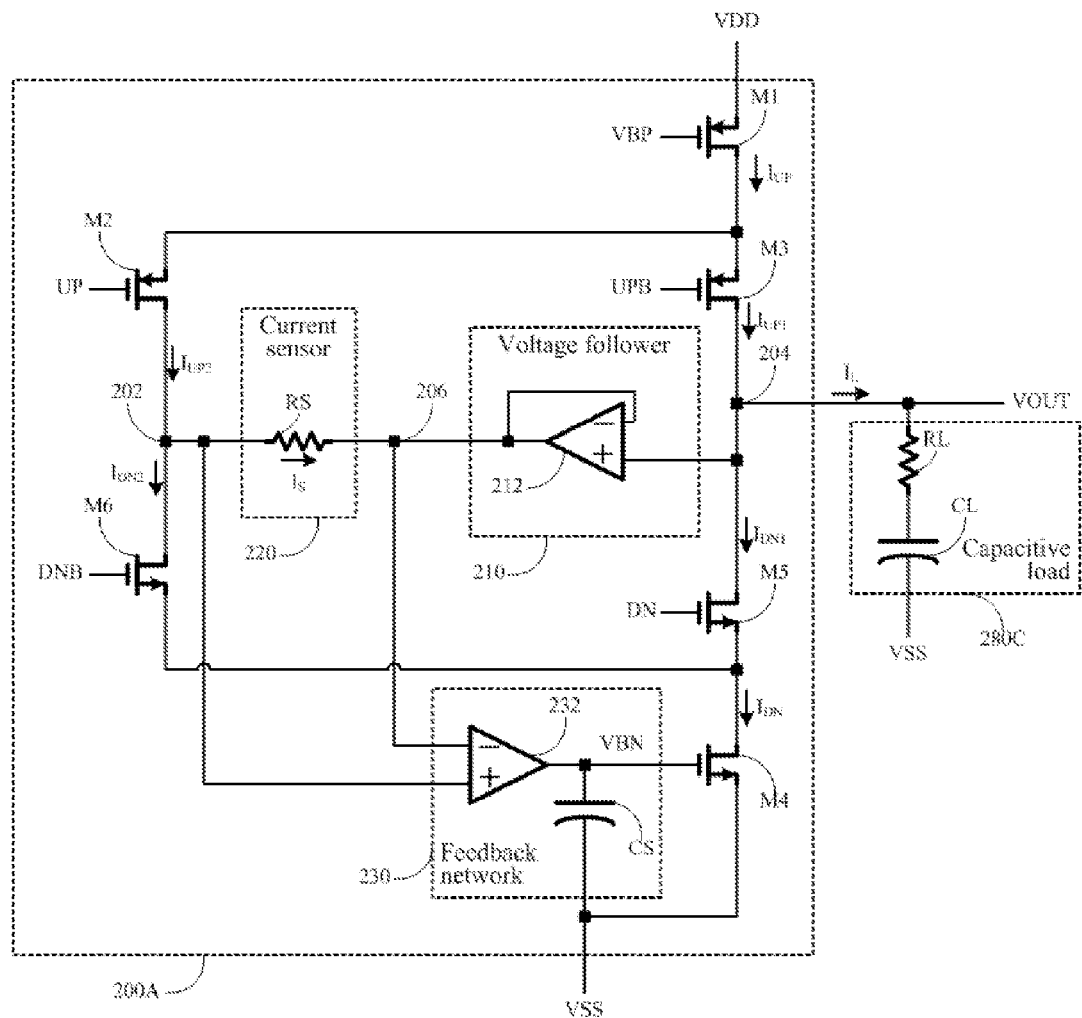
FIG. 2C shows an alternative embodiment of a charge pump circuit constructed in accordance with the invention.
Figure 2D:
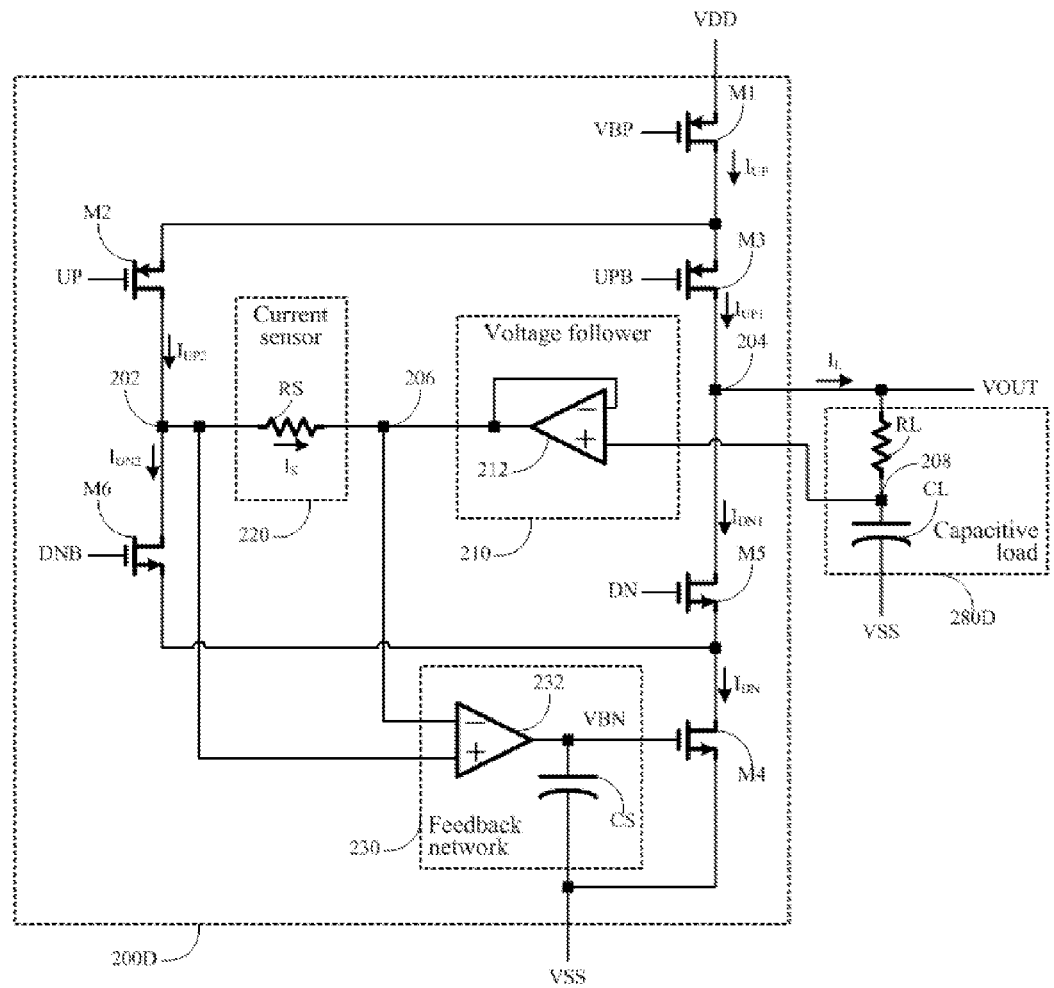
FIG. 2D shows an alternative embodiment of a charge pump circuit constructed in accordance with the invention.

Embodiments of the invention can be practiced in various alternative forms. In an alternative embodiment 200B shown in FIG. 2B, VBN is a substantially fixed bias voltage and VBP a variable bias voltage coupled to an output of the feedback network 230; in this case, the current sink is substantially fixed while the current source is adjusted to match the current sink. In an alternative embodiment 200C shown in FIG. 2C, the load circuit is replaced by 280C comprising a load resistor RL in series with a load capacitor CL. In an yet another embodiment 200D shown in FIG. 2D, the load circuit 280D comprises a load resistor RL in series with a load capacitor CL and the voltage follower 210 of the alternative charge pump 200D receives input from node 208, which is an output node of the load capacitor CL.

Figure 2E:
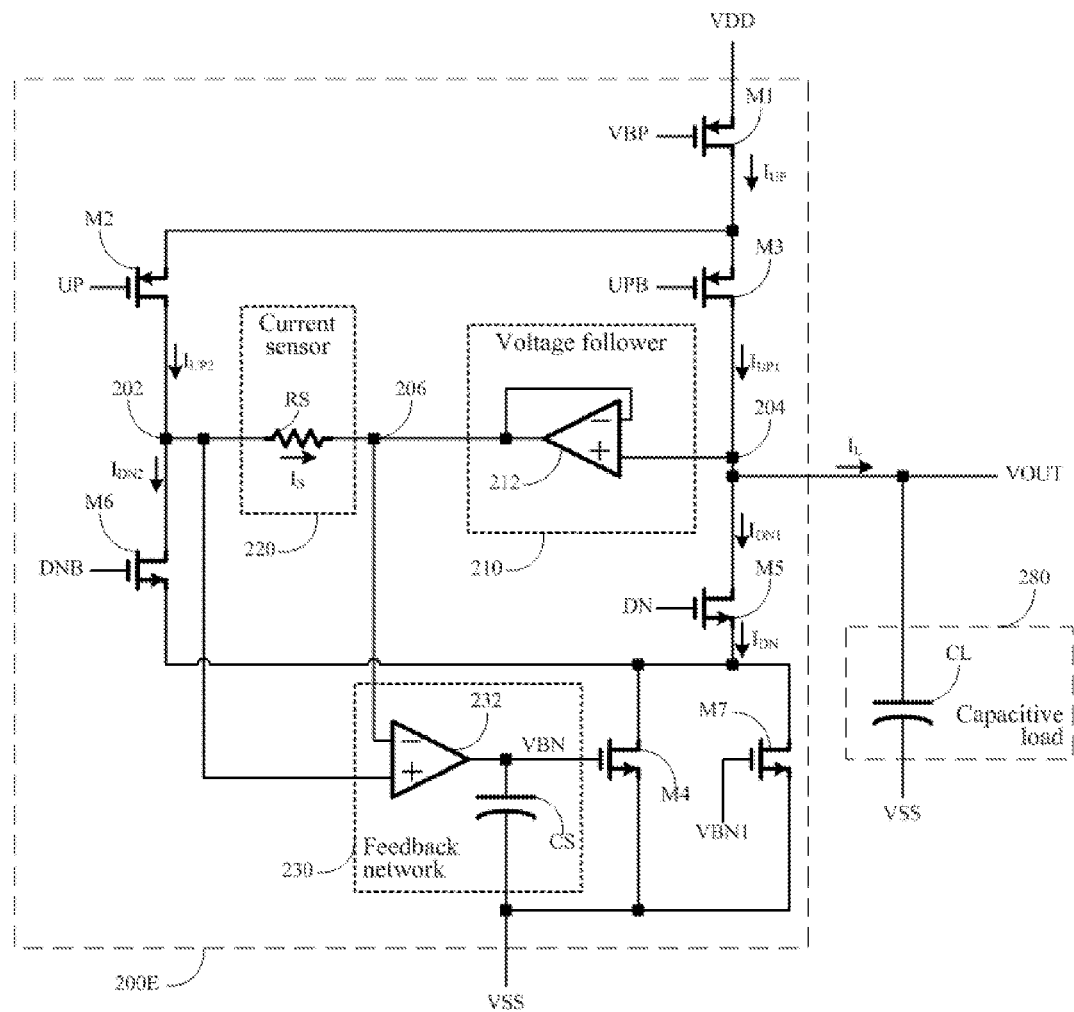
FIG. 2E shows an alternative embodiment of a charge pump circuit constructed in accordance with the invention.

In an alternative embodiment depicted in FIG. 2E, a substantially fixed current sink embodied by a fourth NMOS M7 biased by a substantially fixed bias voltage VBN1 is inserted to ensure the negative current $I_{DN}$ comprises a substantially fixed component. In this case, the fixed bias voltage VBN1 must be chosen such that the absolute value of its output current is no greater than $I_{UP}$, otherwise the steady-state condition stated by (1) can never be reached.

A current sensor can be embodied in whatever circuit known to those of ordinary skill in the art at the discretion of circuit designer. A switch can be embodied in a variety of circuits known to those of ordinary skill in the art at the discretion of circuit designer. A current source/sink can be embodied in whatever circuit known to those of ordinary skill in the art at the discretion of circuit designer. A voltage follower can be embodied in whatever circuit known to those of ordinary skill in the art at the discretion of circuit designer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
   a substantially fixed current source for outputting a first current of a first polarity;
   a variable current source for outputting a second current of a second polarity opposite to the first polarity;
   a first current steering network for steering the first current into either an output node or a termination node in accordance with a first control signal;
   a second current steering network for steering the second current into either the output node or the termination node in accordance with a second control signal;
   a voltage follower for receiving a first voltage associated with the output node and outputting a second voltage at an internal node;
   a current sensor coupled between the termination node and the internal node for sensing a current flowing between the termination node and the internal node; and
   a feedback network for adjusting the variable current source in accordance with an output of the current sensor.

2. The apparatus of claim 1, wherein the output node is coupled to a load circuit comprising a capacitor.

3. The apparatus of claim 1, wherein the first current steering network comprises a switch pair comprising: a first switch coupled between the substantially fixed current source and the output node, and a second switch coupled between the substantially fixed current source and the termination node.

4. The apparatus of claim 3, wherein the first switch is turned on if and only if the first control signal is in a first logical state, and the second switch is turned on if and only if the control logical signal is in a second logical state opposite to the first logical state.

5. The apparatus of claim 1, wherein the second current steering network comprises a switch pair comprising: a first switch coupled between the variable current source and the output node, and a second switch coupled between the variable current source and the termination node.

6. The apparatus of claim 5, wherein the first switch is turned on if and only if the second control signal is in a first logical state, and the second switch is turned on if and only if the second control signal is in a second logical state opposite to the first logical state.

7. The apparatus of claim 1, wherein the feedback network comprising an operational amplifier terminated with a capacitor.

8. The apparatus of claim 7, wherein the output of the current sensor is coupled to an input of the operational amplifier.

9. The apparatus of claim 8, wherein the current sensor comprises a resistor and the output of the current sensor comprises a voltage difference between a first terminal of the resistor and a second terminal of the resistor.

10. The apparatus of claim 7, wherein a voltage at the capacitor is used to control a bias of the variable current source.

11. A method comprising:
generating a first current of a first polarity;
steering the first current of the first polarity into either an output node or a termination node in accordance with a first logical signal;
generating a second current of a second polarity opposite to the first polarity;
steering the second current of the second polarity into either the output node or the termination node in accordance with a second logical signal;
tracking a voltage associated with the output node by using a voltage follower;
sensing a current flowing between the termination node and an internal node at an output of the voltage follower using a current sensor; and
adjusting one of the first current and the second current in accordance with an output of the current sensor.

12. The method of claim 11, wherein the output node is coupled to a load circuit comprising a capacitor.

13. The method of claim 11, wherein the substantially fixed current of the first polarity is steered to the output node if and only if the first logical signal is asserted and steered to the termination node otherwise.

14. The method of claim 11, wherein the second current of the second polarity is steered to the output node if and only if the second logical signal is asserted and steered to the termination node otherwise.

15. The method of claim 11, further comprising:
receiving the output of the current sensor;
amplifying the output of the current sensor using an amplifier; and
filtering an output of the amplifier to generate a control signal.

16. The method of claim 15, wherein filtering the output of the amplifier comprises terminating the output of the amplifier with a capacitor.

17. The method of claim 16, wherein a voltage at the capacitor is used to control a bias of the variable current source.

18. The method of claim 11, wherein the current sensor comprising a resistor inserted between the termination node and the internal node.

19. The method of claim 18, wherein the output of the current sensor comprises a voltage difference between a first terminal of the resistor and a second terminal of the resistor.

20. An apparatus comprising:
a charge pump configured to receive a phase signal representing a result of a phase detection, and to convert the phase signal into a current signal at an output node;
a voltage follower for receiving a first voltage associated with the output node and outputting a second voltage at an internal node of the charge pump;
a current sensor, coupled between a termination node and the internal node, to sense a current flowing between the termination node and the internal node; and
a feedback network to adjust a variable current source of the charge pump in accordance with an output of the current sensor.

* * * * *